(12) United States Patent
Yang et al.

(10) Patent No.: US 7,994,517 B2
(45) Date of Patent: Aug. 9, 2011

(54) ORGANIC LIGHT-EMITTING DISPLAY DEVICE AND METHOD FOR FABRICATING THE SAME

(75) Inventors: Sun A Yang, Suwon-si (KR); Youn Chul Oh, Suwon-si (KR); Eun Jung Lee, Suwon-si (KR); Won Seok Kang, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 901 days.

(21) Appl. No.: 11/715,379

(22) Filed: Mar. 8, 2007

(65) Prior Publication Data

US 2007/0285411 A1 Dec. 13, 2007

(30) Foreign Application Priority Data

Jun. 9, 2006 (KR) .................. 10-2006-0052157

(51) Int. Cl.
H01L 27/15 (2006.01)
(52) U.S. Cl. ............. 257/82; 257/72; 345/207; 362/257
(58) Field of Classification Search .................... 257/40, 257/82, 72; 362/257; 345/207
See application file for complete search history.

(56) References Cited

U.S. PATENT DOCUMENTS

| 7,397,065 B2 * | 7/2008 | Tseng et al. ................ 257/72 |
|---|---|---|
| 2005/0056841 A1 | 3/2005 | Yamazaki et al. |
| 2005/0199876 A1 | 9/2005 | Matsumoto |
| 2005/0258462 A1 | 11/2005 | Min |
| 2006/0012311 A1 | 1/2006 | Ogawa |
| 2006/0164408 A1 | 7/2006 | Nishikawa et al. |
| 2007/0138951 A1 * | 6/2007 | Park et al. ................ 313/504 |
| 2007/0205420 A1 * | 9/2007 | Ponjee et al. ................ 257/80 |

FOREIGN PATENT DOCUMENTS

| CN | 1734541 A | 2/2006 |
|---|---|---|
| EP | 0923067 B1 | 8/2004 |
| EP | 1617399 A2 | 1/2006 |
| JP | 2000-031451 | 1/2000 |
| JP | 2001-085160 A | 3/2001 |
| JP | 2002-280596 | 9/2002 |
| JP | 2002-280596 A | 9/2002 |
| JP | 2006-030317 A | 2/2006 |
| JP | 2006-030318 | 2/2006 |
| KR | 10-1992-0013791 A | 7/1992 |
| KR | 10-2005-0108903 | 11/2005 |
| KR | 10-2006-0041707 A | 5/2006 |
| KR | 10-2006-0050070 | 5/2006 |

OTHER PUBLICATIONS

Bradley D. Clymer, "Surface-relief grating structures for efficient high bandwidth integrated photodetectors for optical interconnections in silicon VLSI," Appl. Opt. 28, 5374-5382 (1989).*

* cited by examiner

Primary Examiner — Kiesha R Bryant
Assistant Examiner — Mark W Tornow
(74) Attorney, Agent, or Firm — Lee & Morse, P.C.

(57) ABSTRACT

An organic light emitting display device includes a substrate, a thin film transistor having a gate insulating layer and an inter-insulating layer, an organic light emitting diode electrically connected with the thin film transistor, and a photo sensor, wherein the gate insulating layer includes a relief structure positioned above the photo sensor.

19 Claims, 5 Drawing Sheets

ORGANIC LIGHT-EMITTING DISPLAY DEVICE AND METHOD FOR FABRICATING THE SAME

BACKGROUND OF THE INVENTION

1. Field of the Invention

The present invention relates to organic light-emitting display devices. In particular, the present invention relates to an organic light-emitting display device having a photo sensor with a relief structure capable of increasing an amount of light absorbed therein and a method of fabricating the same.

2. Description of the Related Art

In general, an organic light-emitting diode is a flat display device where voltage may be applied to a plurality of layers interposed between two electrodes, i.e., an anode electrode and a cathode electrode, to combine electrons and holes to form images. In particular, the conventional organic light-emitting display device may include a hole injecting layer, a hole transporting layer, at least one organic light emitting layer, an electron injecting layer and an electron transporting layer between the electrodes. Accordingly, holes may be injected into the hole injecting layer from the anode electrode, so the injected holes may be transported to the light emitting layer through the hole transporting layer. Similarly, electrons may be injected into the electron injecting layer from the cathode electrode, so the injected electrons may be transported to the light emitting layer through the electron transporting layer. The transported holes and electrons may combine with one another in the light emitting layer, to form excitons and, thereby, emit visible light and form images.

The conventional organic light emitting layer of the organic light-emitting display device may deteriorate over time and, thereby, reduce brightness of light emitted therefrom and/or modify color coordinates thereof. Reduced brightness of light emitted from the organic light emitting layer may decrease the image quality of the organic light emitting display device and its overall lifespan. Attempts have been made to improve the brightness of the organic light-emitting display device by incorporating a photo sensor therein. However, the conventional photo sensor may have a low light receiving rate, thereby providing a limited brightness control of the organic light-emitting display device.

Accordingly, there exists a need for an organic light-emitting display device with a photo sensor capable of controlling brightness thereof, while exhibiting an improved light receiving rate.

SUMMARY OF THE INVENTION

The present invention is therefore directed to an organic-light emitting display device and a method of fabricating the same, which substantially overcome one or more of the disadvantages of the related art.

It is a feature of the present invention to provide an organic light-emitting display device having a photo sensor with a relief structure thereabove, such that the photo sensor is capable of receiving an enhanced amount of internal light from an organic light-emitting diode.

It is another feature of the present invention to provide a method of fabricating an organic light-emitting display device having a photo sensor with a relief structure formed in a gate insulating layer thereabove and capable of enhancing an amount of light received from an organic light-emitting diode.

At least one of the above and other features and advantages of the present invention may be realized by providing an organic light-emitting display device including, a substrate, a thin film transistor having a gate insulating layer with a first relief structure and an inter-insulating layer, an organic light-emitting diode electrically connected with the thin film transistor, and a photo sensor between the substrate and the first relief structure.

A portion of the gate insulating layer may be positioned on the substrate between the thin film transistor and the photo sensor. Additionally, the gate insulating layer may include silicon oxide or silicon nitride.

The first relief structure may be positioned directly above the photo sensor. The first relief structure may be a convex structure. Alternatively, the first relief structure may be a concave structure. According to yet another alternative, the first relief structure may have a tooth-type pattern.

The photo sensor may be capable of absorbing light emitted from the organic light-emitting diode and converting the absorbed light into electrical signals. The electrical signals may be capable of controlling brightness of the light emitted from the organic light-emitting diode.

The inter-insulting layer may include a second relief structure. The second relief structure may be positioned directly above the first relief structure. Additionally, the second relief structure may have a concave structure, a convex structure, a tooth-type pattern, and so forth.

The organic light-emitting diode may be a rear-type organic light-emitting diode. Additionally, the organic light-emitting display device may include a buffer layer on the substrate.

According to another aspect of the present invention, there is provided a method for fabricating an organic light-emitting display device including forming a semiconductor layer on a substrate, forming a photo sensor on the substrate, such that the photo sensor is separated from the semiconductor layer, forming a gate insulating layer over the semiconductor layer and the photo sensor, patterning a surface of the gate insulating layer above the photo sensor to form a first relief structure, forming a gate electrode and a source/drain electrode on the semiconductor layer, and forming an organic light-emitting in electric communication with the source/drain electrode.

Patterning the surface of the gate insulating layer may include etching. The method for fabricating the organic light-emitting display device may further include forming an inter-insulating layer on the gate electrode. Additionally, the method for fabricating the organic light-emitting display device may include patterning the surface of the inter-insulating layer above the photo sensor to form a second relief structure.

In yet another aspect of the present invention, there is provided a portable electronic apparatus, including an organic light-emitting display device having a substrate, a thin film transistor with a gate insulting layer, an organic light-emitting diode electrically connected with the thin film transistor, and a photo sensor, wherein the gate insulting layer may include a relief structure above the photo sensor.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
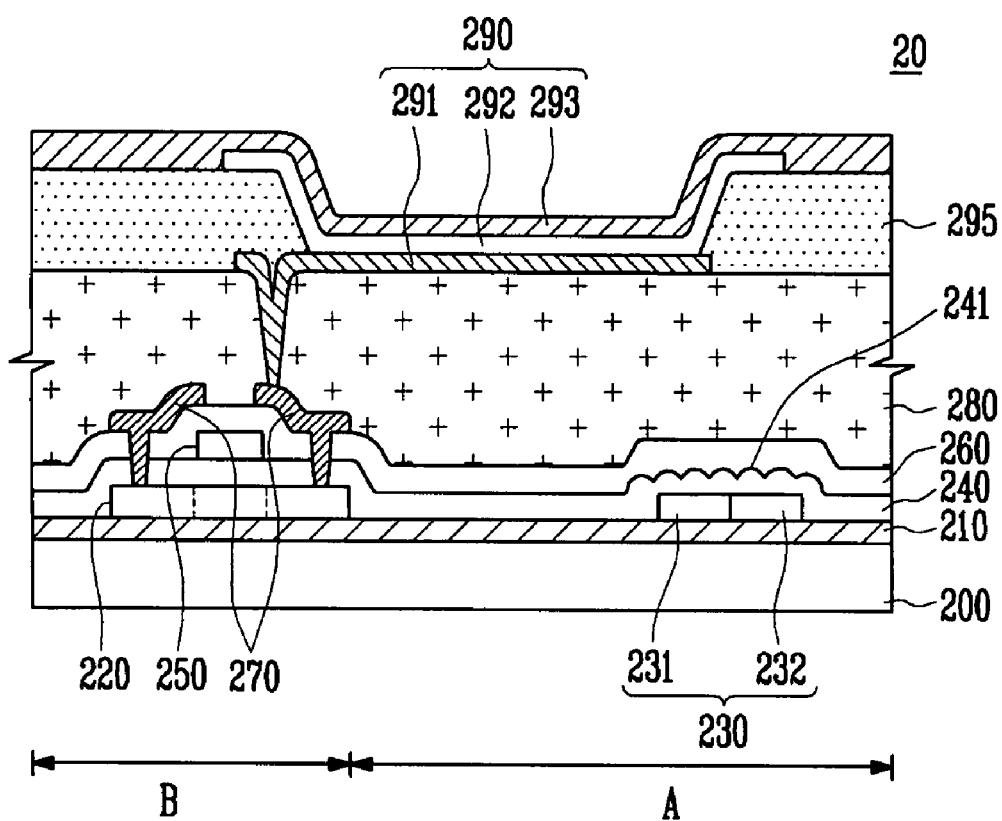
FIG. 1 illustrates a cross-sectional view of an organic light-emitting display device according to an embodiment of the present invention.

Korean Patent Application No. 10-2006-0052157, filed on Jun. 9, 2006, in the Korean Intellectual Property Office, and entitled: "Organic Light Emitting Diode and Method for Fabricating the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or an element is referred to as being "on" another layer, element or substrate, it can be directly on the other layer, element or substrate, or intervening layers or elements may also be present. Further, it will be understood that when a layer or an element is referred to as being "under" another layer or element, it can be directly under, or one or more intervening layers or elements may also be present. In addition, it will also be understood that when a layer or an element is referred to as being "between" two layers or elements, it can be the only layer or element between the two layers or elements, or one or more intervening layers or elements may also be present. Like reference numerals refer to like elements throughout.

Hereinafter, an exemplary embodiment of an organic light-emitting display device according to the present invention will be described in more detail below with reference to FIG. 1. As illustrated in FIG. 1, an organic light-emitting display device 20 according to an embodiment of the present invention may include a substrate 200; a buffer layer 210; a photo sensor 230 on the buffer layer 210; a thin film transistor having a semiconductor layer 220, a gate insulating layer 240, a gate electrode 250 and a source/drain electrode 270; and an organic light-emitting diode 290 electrically connected with the thin film transistor.

The substrate 200 of the organic light-emitting display device 20 may be made of any insulating material, e.g., glass, plastic, silicon, synthetic resin, and so forth, as determined by one of ordinary skill in the art. Preferably, the substrate 200 may be transparent, e.g., a glass substrate. Additionally, the substrate 200 may be formed to have a pixel region A and a non-pixel region B therein, as illustrated in FIG. 1, such that the pixel region A may include a region of the substrate 200 that is capable of displaying images, e.g., an area including the organic light emitting diode 290, and the non-pixel region B may include all regions of the substrate 200 that are not capable of displaying images, i.e., regions other than the pixel region A. For example, the thin film transistor may be formed in the non-pixel region B.

The buffer layer 210 of the organic light-emitting display device 20 may be selectively formed on the substrate 200 of silicon nitride (SiNx) or silicon oxide (SiO$_2$). The buffer layer 210 may minimize diffusion of impurities into the semiconductor layer 220 or the photo sensor 230 during post-processing thereof.

Photo sensor 230 of the light-emitting display device 20 may be any suitable optical sensor capable of receiving a light signal and converting the light signal into an electrical signal, e.g., current or voltage. For example, the photo sensor 230 may be a semiconductor device having a light detecting function, such as a diode with a light detecting function at a junction thereof, i.e., a photo diode. In other words, because electrons or holes may be generated by means of absorption of photons, and a conductivity of a diode may be modulated with respect to a light signal detected therein, a diode functioning as the photo sensor 230 may convert light signals into electrical signals by modifying a current flow with respect to detected optical changes, i.e., absorbed photons.

The photo sensor 230 may be formed on the buffer layer 210. In particular, the photo sensor 230 may be formed above the pixel region A of the substrate 200 of amorphous silicon. More specifically, the photo sensor 230 may include a N-type doping region 231, a P-type doping region 232, and an intrinsic region therebetween (not shown), and be positioned on the buffer layer 210, i.e., between the substrate 200 and the organic light emitting diode 290, such that vertical rays of light emitted from the organic light-emitting diode 290 may reach the photo sensor 230.

If an anode voltage is applied to the P-type doping region 232 and a cathode voltage is applied to the N-type doping region 231, the intrinsic region between the N-type doping region 231 and the P-type doping region 232 may become fully depleted, thereby generating and accumulating charges by absorbing light emitted from the organic light-emitting diode 290 and converting them into electrical signals. The electrical signals generated by the photo sensor 230 in response to the absorbed light signals may represent actual brightness values of the organic light-emitting diode 290 and be compared to a predetermined brightness reference value. Any deviation of the actual brightness values from the predetermined brightness reference value may be controlled by the photo sensor 230, thereby facilitating constant brightness output from the organic light-emitting diode 290, i.e., light generated by the light emitting layer 292.

More specifically, for example, electric signals generated by the photo sensor 230, i.e., signals representing actual brightness values, may be supplied to a signal processing part and, subsequently, to a gamma compensating part in order to perform a predetermined gamma revision and to generate a standard voltage corresponding to each gradation level. The standard voltage corresponding to each gradation level may be applied to a data signal generator to generate a data signal based on the standard voltage and to be applied to respective data lines. Alternatively, electric signals generated by the photo sensor 230 may be supplied to a controller, so that the controller may output a respective control signal for controlling the brightness of the light emitting layer 292 with respect to the internal light thereof.

The semiconductor layer 220 of the thin film transistor may be formed to have a predetermined pattern in the non-pixel region B on the buffer layer 210. In particular, the semiconductor layer 220 may be formed by crystallizing an amorphous silicon layer into a low temperature polysilicon (LTPS) via, for example, laser irradiation.

The gate insulating layer 240 of the thin film transistor may be formed on the semiconductor layer 220 and the photo sensor 230 of silicon nitride (SiNx), silicon oxide (SiO$_2$), and so forth. In particular, the gate insulating layer 240 may be disposed between the semiconductor layer 220 and the gate electrode 250, as illustrated in FIG. 1, and a surface portion of the gate insulating layer 240 above the photo sensor 230 and in communication with the inter-insulating layer 260 may be formed to include a relief structure 241, e.g., a convex structure having a plurality of u-shaped indents, a concave structure having a plurality of inverted u-shaped projections, a tooth structure having a plurality of rectangular teeth, and so forth. Without intending to be bound by theory, it is believed that formation of the relief structure 241 above the photo sensor 230 may increase the condensing efficiency of the light incident from the organic light-emitting diode 290 to the photo sensor 230 due to increased surface area of the gate insulating layer 240 above the photo sensor 230. In other words, formation of the relief structure 241 in the gate insulating layer 240 above the photo sensor 230 may increase the surface area per unit area of the gate insulating layer 240 and decrease the light incidence angle thereon, thereby maximizing incident light efficiency, i.e., providing larger incidence area for a same amount of light to increase the amount and rate of light received by the photo sensor 230.

The gate electrode 250 of the thin film transistor may be disposed in a predetermined pattern on the gate insulating layer 240 in the non-pixel region B. An inter-insulating layer 260 may be disposed on the gate electrode 250 and on the gate insulting layer 240. In particular, the inter-insulating layer 260 may be positioned between the gate insulting layer 240 and the organic light-emitting diode 290 in the non-pixel area B and be in communication with the gate insulating layer 240, as illustrated in FIG. 1.

The source/drain electrode 270 of the thin film transistor may be disposed over the inter-insulating layer 260 and electrically connected with both sides of the semiconductor layer 220 via a contact hole formed through the gate insulating layer 240 and the inter-insulating layer 260.

The organic light-emitting diode 290 of the light-emitting display device 20 may be formed on the substrate 200 and include a first electrode layer 291, a second electrode layer 293, and a light emitting layer 292 therebetween. The organic light-emitting diode 290 may be electrically connected to the thin film transistor, i.e., any one of the source and drain electrodes 270, via a hole.

The first electrode layer 291 of the organic light emitting diode 290 may be made any suitable transparent conductor, e.g., indium-tin-oxide (ITO), indium-zinc-oxide (IZO), zinc oxide (ZnO), and so forth. The second electrode layer 293 of the organic light-emitting diode 290 may be formed on the first electrode layer 291. At least one layer of the second electrode layer 293 may be made of a reflective metal film as a bottom emission type. The light emitting layer 292 of the organic light-emitting diode 290 may be formed between the first and second electrode layers 291 and 293, respectively. In particular, the light emitting layer 292 may be formed to partially expose the first electrode layer 291. Further, the light emitting layer 292 may include a hole injecting layer, a hole transporting layer, an electron transporting layer and an electron injecting layer. Accordingly, the light emitting layer 292 may generate light when holes and electron injected from the first and second electrode layers 291 and 293, respectively, are coupled therein. Further, the light emitted from the light emitting layer 292 may be emitted to the substrate 200 through the transparent first electrode layer 291 due to the reflective metal film employed in the second electrode layer 293.

The light-emitting display device 20 according to an embodiment of the present invention may also include a planarization layer 280. The planarization layer 280 may be formed on the inter-insulating layer 260 and the source/drain electrode 270 by depositing a layer of an oxide film, e.g., SiO$_2$, a nitride film, e.g., (SiNx), and so forth. In particular, the planarization layer 280 may be positioned between the thin film transistor and the organic light emitting diode 290, and a portion of the planarization layer 280 may be etched to expose one of the source and drain electrodes 270 of the thin film transistor in order to provide a connection between the thin film transistor and the organic light emitting diode 290.

The light-emitting display device 20 according to an embodiment of the present invention may also include a pixel defining film 295. The pixel defining film may be formed on the planarization layer 280, such that the pixel defining film 295 may include an opening part (not shown) to at least partially expose the first electrode layer 291 of the organic light emitting diode 290. In particular, portions of the pixel defining film 295 may be positioned between the first and second electrode layers 291 and 293 of the organic light emitting diode 290. The pixel defining film 295 may be made of an organic insulation material, e.g., acrylic organic compounds, polyamides, polyimides, and so forth.

Figure 2:
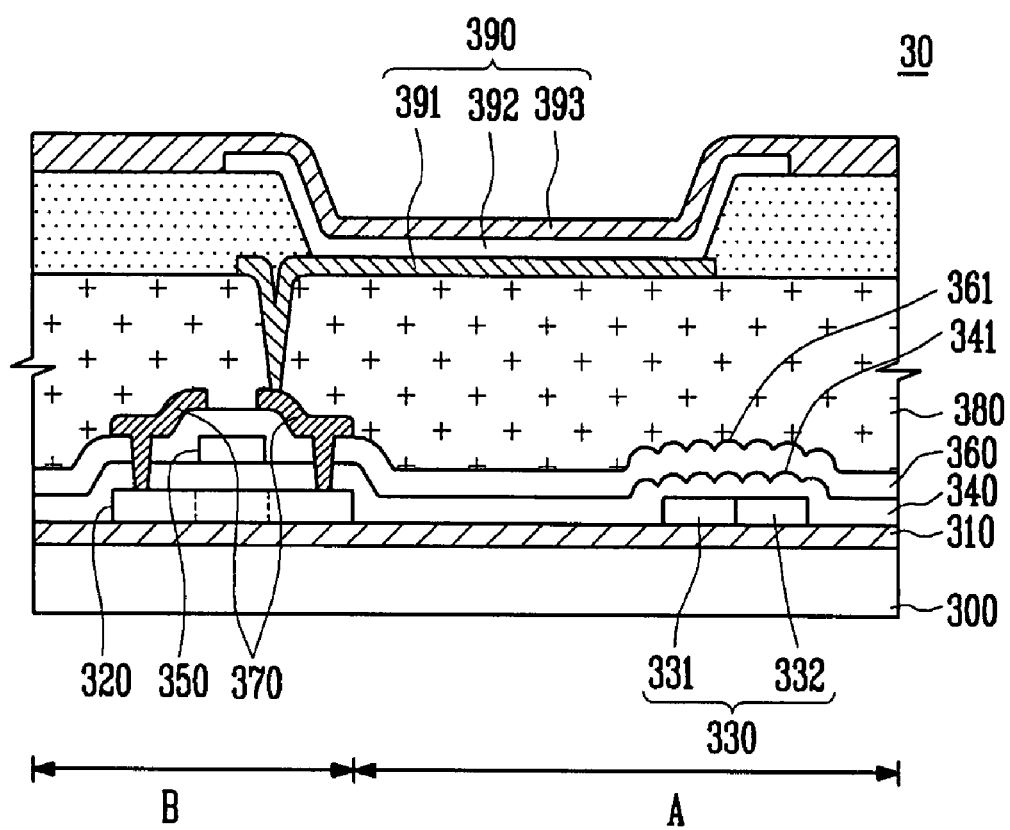
FIG. 2 illustrates a cross-sectional view of an organic light-emitting display device according to another embodiment of the present invention.

In another exemplary embodiment of the present invention, illustrated in FIG. 2, an organic light-emitting display device 30 may include a substrate 300, a buffer layer 310; a photo sensor 330 on the buffer layer 310; a thin film transistor having a semiconductor layer 320, a gate insulating layer 340, a gate electrode 350 an inter-insulating layer 360, and a source/drain electrode 370; and an organic light-emitting diode 390 electrically connected with the thin film transistor. Additionally, the organic light-emitting display device 30 may include first and second relief structures 341 and 361 on upper surfaces of the gate insulating layer 340 and the inter-insulating layer 360, respectively. It should be noted, however, that some elements of the organic light-emitting display device 30 may be similar to elements of the organic light-emitting display device 20 described previously with respect to FIG. 1 and, accordingly, detailed descriptions of similar elements will not be repeated hereinafter.

The first relief structure 341 may be formed similarly to the relief structure 241 previously described with respect to FIG. 1. The second relief structure 361 may be formed on the upper surface of the inter-insulating layer 360 by a similar method and in a similar shape as the first relief structure 341. In particular, the first and second relief structures 341 and 361 may be formed to have a convex pattern or a concave pattern in order to increase the condensing efficiency of the light incident from the organic light-emitting diode 390 to the photo sensor 330. Without intending to be bound by theory, it is believed that formation of the second relief structure 361 above the photo sensor 330, in addition to the first relief structure 341, may condense efficiency of the light incident from the organic light-emitting diode 390 toward the photo sensor 330 even further. Accordingly, more electrons or holes may be generated in the photo sensor 330 to improve brightness control of the organic light-emitting diode 390.

In this respect, it should be noted that even though the first and second relief structures 341 and 361 are illustrated in FIG. 2 as convex patterns directly above the photo sensor 330, other patterns of relief structures are not excluded from the scope of the present invention. For example, any structure capable of improving the light receiving rate of the photo sensor 330 by increasing the surface area for incident light thereon, e.g., a tooth-type pattern on an entire surface of the gate insulating layer 340 or the inter-insulating layer 360, may be employed.

According to another exemplary embodiment of the present invention illustrated with reference to FIGS. 3A-3E, a method for fabricating the organic light-emitting display device previously described with respect to FIG. 1 will be described in detail below.

Figure 3A:
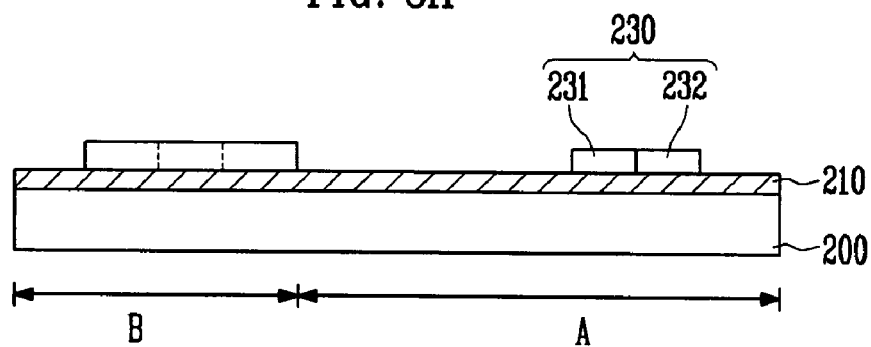
FIGS. 3A-3E illustrate sequential steps in a process for fabricating the organic light-emitting display device illustrated in FIG. 1.

As illustrated in FIG. 3A, a buffer layer 210 may be formed on an upper surface of a substrate 200. In particular, the buffer layer 210 may be formed of silicon nitride (SiNx) or silicon oxide (SiO$_2$) to a thickness of from about 3000 angstroms by any method known in the art, e.g., plasma enhanced chemical vapor deposition (PECVD).

The semiconductor layer 220 may be formed on the non-pixel region B of the substrate 200 of silicon and organic material. In particular, the semiconductor layer 220 may be deposited on the buffer layer 210 to a thickness of about 300 angstroms to about 2000 angstroms by chemical vapor deposition (CVD). Once the semiconductor layer 220 is deposited, it may be patterned into a predetermined shape, e.g., an island shape.

The photo sensor 230 may be formed on the pixel region A of the substrate 200. For example, the photo sensor 230 may be formed on the buffer layer 210 at a predetermined distance from the semiconductor layer 220. In other words, even though both the photo sensor 230 and the semiconductor layer 220 may be formed on the buffer layer 210, there may be a distance therebetween. For example, a portion of a gate insulating layer 240 may be placed therebetween, as will be discussed in more detail below. It should further by noted that the photo sensor 230 may be formed anywhere in the pixel region A, i.e., anywhere between the first buffer layer 210 and the first electrode 291, as long as vertical rays of light emitted from the light emitting layer 292 of the organic light-emitting diode 290 may be incident thereon. Accordingly, the location of the photo sensor 230 should not be limited to the illustrations in FIGS. 3A-3E.

The photo sensor 230 may be formed by depositing an amorphous silicon layer and, subsequently, crystallizing the amorphous silicon layer by a predetermined heat treatment to form a polycrystalline silicon layer. The polycrystalline silicon layer may be patterned and injected with high concentrations of N and P types impurities to form the N-type doping region 231 and P-type doping region 232 in first and second regions of the polycrystalline silicon, respectively. The N-type doping region 231 and the P-type doping region 232 may be formed in both edges of the polycrystalline silicon layer.

Figure 3B:
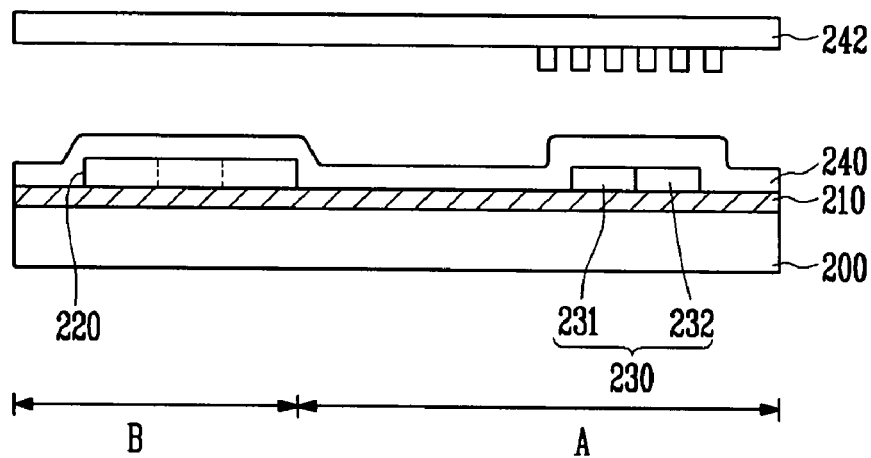
Figure 3C:
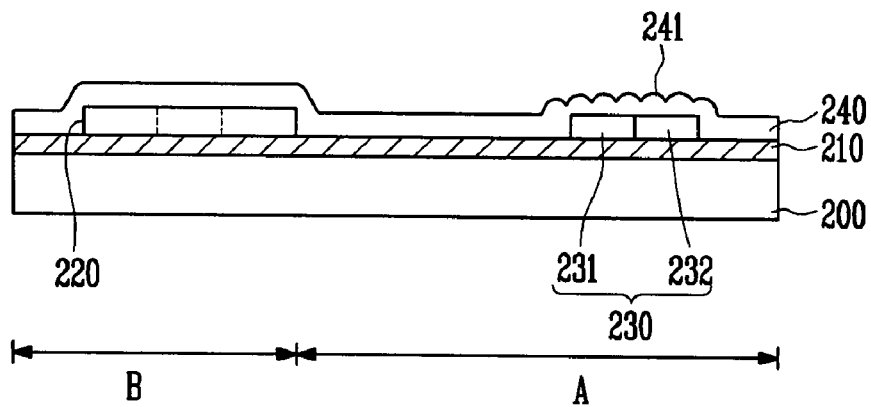

Next, as illustrated in FIG. 3B, the gate insulating layer 240 may be deposited over the semiconductor layer 220 and the photo sensor 230. In particular, the gate insulating layer 240 may be formed of silicon nitride (SiNx) or silicon oxide (SiO$_2$) at a thickness of about 700 angstroms to about 1500 angstroms by PECVD. Subsequently, a photo mask 242 having a pattern corresponding to a relief structure may be applied to the gate insulating layer 240, such that the relief pattern may be positioned on the gate insulating layer 240 above a location of the photo sensor 230. Consequently, an exposure process and a development process may be performed on the gate insulating layer 240. In this respect, it should be noted that the pattern of the photo mask 242 may be controlled in terms of hemisphere length, i.e., diameter, height, angle, pattern intervals/overlaps, and so forth in order to maximize the condensing efficiency of the relief structure 241 upon formation thereof. As illustrated in FIG. 3C, portions from the upper surface, i.e., a surface in contact with the photo mask 242, of the gate insulating layer 240 may be removed during the exposure and development processes, such that the pattern of the photo mask 242 may be imparted onto the gate insulating layer 240 to form the relief structure 241 above the photo sensor 230. In other words, portions of the gate insulating layer 240 may be removed to form, for example, a tooth-type pattern thereon. The tooth-type pattern may be hardened by any convenient heat treatment as determined by one of ordinary skill in the art to form a relief structure 241 having a convex structure or a concave structure.

In general, the relief structure 241 may be formed to have a plurality of sequential elliptical spheres or hemispheres having a diameter of about several μm to about several tens of μm, and maintain an angle of about 5° to about 30° with respect to the horizontal surface of the photo sensor 230. For example, if the diameter of the plurality of hemispheres has a length of about several μm, the maximum light receiving rate, i.e., incident light emitted from the organic light emitting diode 290, may be at an angle of about (−30)° with respect to the horizontal surface of the photo sensor 230.

Figure 3D:
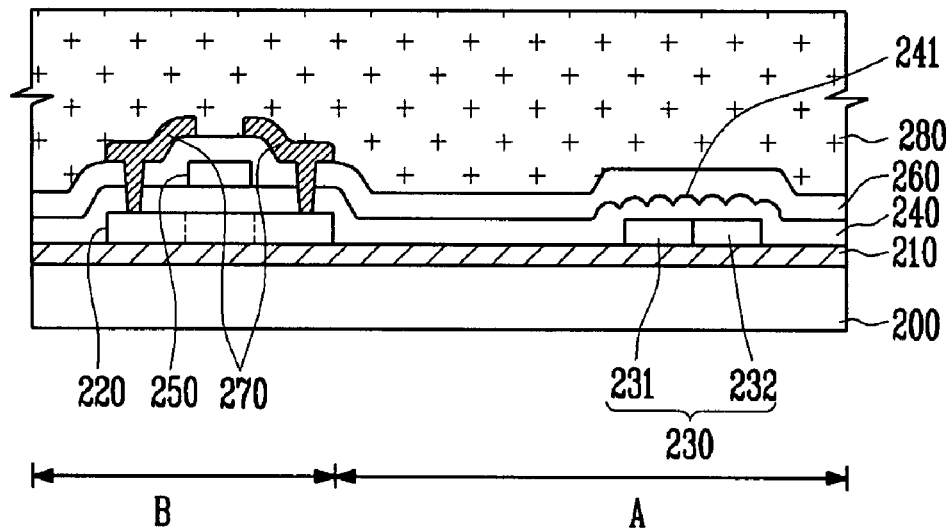

Next, as illustrated in FIG. 3D, a gate electrode 250 may be disposed on the semiconductor layer 220, such that the gate insulating layer 240 may be positioned therebetween. The gate electrode 250 may be formed by sputtering a conductive metal, e.g., aluminum (Al) or aluminum alloy, molybdenum tungsten (MoW), molybdenum (Mo), copper (Cu), silver (Ag) or silver alloy, indium tin oxide (ITO), indium zinc oxide (IZO), a translucent metal, and so forth, on the gate insulating layer 240 to a thickness of about 2000 angstroms to about 3000 angstroms, and subsequently, patterning the deposited conductive metal into a predetermined shape. An inter-insulating layer 260 may be disposed on the gate insulating layer 240 and the gate electrode 250 by the same method as previously described with respect to the gate insulating layer 240.

Next, a source/drain electrode 270 may be formed on the inter-insulating layer 260 above the gate electrode 250 and electrically connected with the semiconductor layer 220 to complete formation of the thin film transistor. In other words, at least one contact hole may be formed through the gate insulating layer 240 and the inter-insulating layer 260, such that each side of the source/drain electrode 270 may be in electrical communication with the semiconductor layer 220. A planarization layer 280 may be formed on the inter-insulating layer 260, such that the source/drain electrode 270 may be positioned therebetween.

Figure 3E:
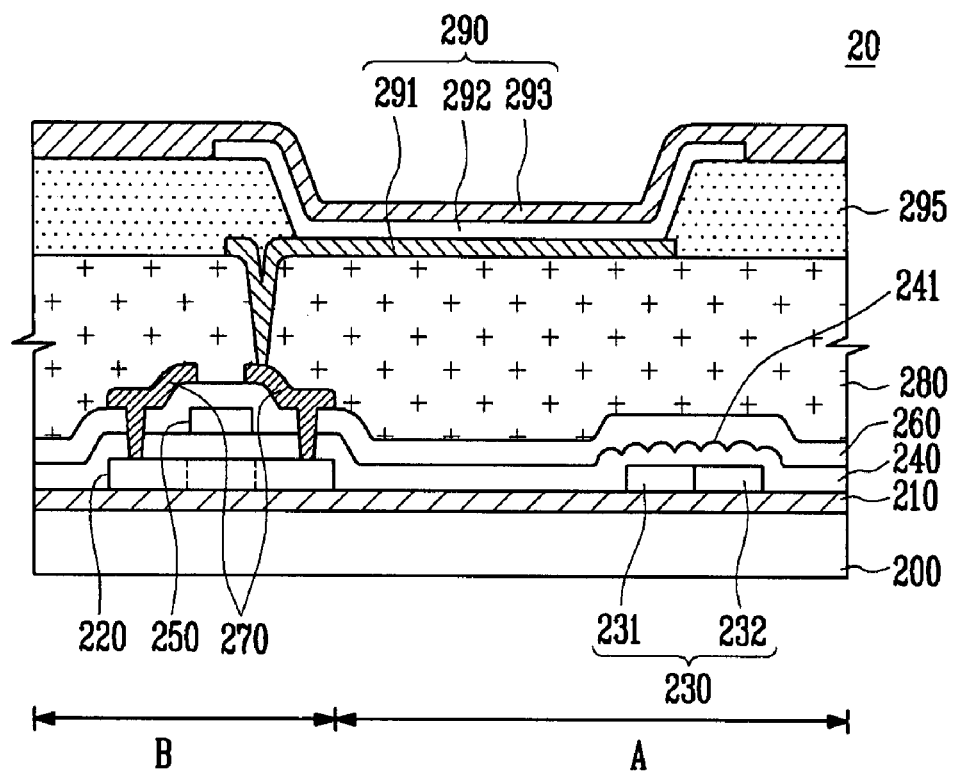
Figure 4:
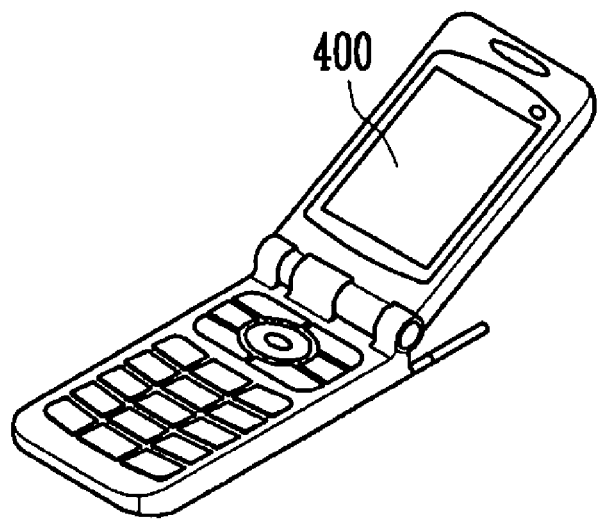
FIGS. 4-5 illustrate views of exemplary portable electronic devices having an organic light-emitting display device according to an embodiment of the present invention.

The organic light-emitting diode 290 may be positioned on the planarization layer 280 and electrically connected to any one of the source/drain electrodes 270. In particular, as illustrated in FIG. 3E, the first electrode layer 291 of the organic light-emitting diode 290 may be electrically connected with the source or drain electrode 270 via a hole formed by etching through the planarization layer 280. A second electrode layer 293 may be formed to have at least one reflective metal film, and the second electrode layer 293 may be disposed on the first electrode layer 291, having a light emitting layer 292 formed therebetween. The light emitting layer 292 may include a hole injecting layer, a hole transporting layer, an electron transporting layer and an electron injecting layer. The pixel defining layer 295 may be formed between the light emitting layer 292 and the first electrode layer 291. In particular, the pixel defining layer 295 may be formed by applying an organic insulation material, e.g., acrylic organic compounds, polyamides, and so forth, on the planarization layer 280, such that portions of the pixel defining layer 295 may be positioned between the light emitting layer 292 and the first electrode layer 291. The pixel defining layer 295 may include an opening part to at least partially expose the first electrode layer 291.

Figure 5:
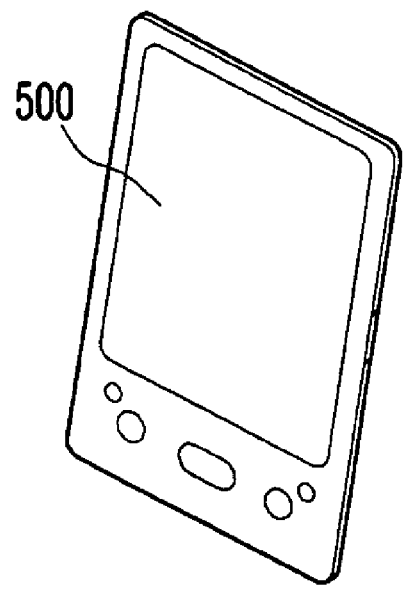

As illustrated in FIGS. 5-6, the organic light-emitting display devices according to embodiments previously described with respect to FIGS. 1-4 may be employed in any portable electronic apparatus, e.g., a cellular phone, a lap-top type computer, a digital camera, a personal multimedia player (PMP), and so forth, as described be one of ordinary skill in the art.

As described above, the present invention is advantageous in providing an organic light-emitting display device having a photo sensor capable of absorbing an increased amount of internal light from the organic light emitting diode due to increased light incidence surface area above the photo sensor, thereby providing enhanced brightness control of the organic light-emitting display device. As such, the present invention may advantageously minimize brightness and image quality wear due to organic layer deterioration, thereby enhancing current flow into pixels and improving overall quality and lifespan of the organic light-emitting display device.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting display device, comprising:
    a substrate;
    a thin film transistor having a gate insulating layer and an inter-insulating layer on the substrate, the gate insulating layer including a first relief structure;
    an organic light-emitting diode electrically connected with the thin film transistor; and
    a photo sensor between the substrate and the first relief structure, the photo sensor having a plurality of doping regions, wherein the first relief structure includes a plurality of sequential elliptical or hemispherical structures above and overlapping each of the doping regions of the photo sensor, a diameter of each elliptical or hemispherical structure being substantially smaller than a length of each one of the doping regions of the photo sensor.

2. The organic light-emitting display device as claimed in claim 1, wherein a portion of the gate insulating layer is positioned on the substrate between the thin film transistor and the photo sensor.

3. The organic light-emitting display device as claimed in claim 1, wherein the first relief structure has a convex structure with a plurality of inverted U-shaped protrusions overlapping each of the doping regions of the photo sensor, the indents and protrusions being arranged alternately above the doping regions.

4. The organic light-emitting display device as claimed in claim 1, wherein the first relief structure has a concave structure with a plurality of U-shaped indents overlapping each of the doping regions of the photo sensor.

5. The organic light-emitting display device as claimed in claim 1, wherein the first relief structure has a tooth-type pattern overlapping the entire photo sensor.

6. The organic light-emitting display device as claimed in claim 1, wherein the first relief structure is only in a region directly above the photo sensor.

7. The organic light-emitting display device as claimed in claim 1, wherein the gate insulating layer includes silicon oxide or silicon nitride.

8. The organic light-emitting display device as claimed in claim 1, wherein the photo sensor is capable of absorbing light emitted from the organic light-emitting diode and converting the absorbed light into electrical signals.

9. The organic light-emitting display device as claimed in claim 8, wherein the electrical signals are capable of controlling brightness of the light emitted from the organic light-emitting diode.

10. The organic light-emitting display device as claimed in claim 1, wherein the organic light-emitting diode is a rear-type organic light-emitting diode.

11. The organic light-emitting display device as claimed in claim 1, wherein the inter-insulating layer includes a second relief structure, the second relief structure above and overlapping the first relief structure.

12. The organic light-emitting display device as claimed in claim 11, wherein the second relief structure is directly above the first relief structure.

13. The organic light-emitting display device as claimed in claim 11, wherein the second relief structure has a convex structure, a concave structure, or a tooth-type pattern.

14. The organic light-emitting display device as claimed in claim 1, further comprising a buffer layer on the substrate.

15. A method for fabricating an organic light-emitting display device, comprising:
    forming a semiconductor layer on a substrate;
    forming a photo sensor having a plurality of doping regions on the substrate, such that the photo sensor is separated from the semiconductor layer;
    forming a gate insulating layer over the semiconductor layer and the photo sensor;
    patterning a surface of the gate insulating layer above the photo sensor to form a first relief structure, wherein the first relief structure includes a plurality of sequential elliptical or hemispherical structures above and overlapping each of the doping regions of the photo sensor, a diameter of each elliptical or hemispherical structure being substantially smaller than a length of each one of the doping regions of the photo sensor;
    forming a gate electrode and a source/drain electrode on the semiconductor layer; and
    forming an organic light-emitting diode in electric communication with the source/drain electrode.

16. The method for fabricating an organic light-emitting display device as claimed in claim 15, wherein patterning the surface of the gate insulating layer includes etching.

17. The method for fabricating an organic light-emitting display device as claimed in claim 15, further comprising forming an inter-insulating layer on the gate electrode.

18. The method for fabricating an organic light-emitting display device as claimed in claim 16, further comprising patterning a surface of the inter-insulating layer above the photo sensor to form a second relief structure.

19. A portable electronic apparatus, comprising an organic light-emitting display device having a substrate, a thin film transistor with a gate insulting layer, an organic light-emitting diode electrically connected with the thin film transistor, and a photo sensor having a plurality of doping regions, wherein the gate insulting layer includes a relief structure above the photo sensor, wherein the first relief structure includes a plurality of sequential elliptical or hemispherical structures above and overlapping each of the doping regions of the photo sensor, a diameter of each elliptical or hemispherical structure being substantially smaller than a length of each one of the doping regions of the photo sensor.

* * * * *